(12) United States Patent
Tsai et al.

(10) Patent No.: US 10,177,216 B2
(45) Date of Patent: Jan. 8, 2019

(54) METAL-OXIDE-METAL CAPACITOR

(71) Applicant: MEDIATEK INC., Hsin-Chu (TW)

(72) Inventors: Chih-Hou Tsai, New Taipei (TW);
Wei-Hao Tsai, Taichung (TW);
Rong-Sing Chu, Taoyuan (TW);
Ying-Zu Lin, Taichung (TW);
Chao-Hsin Lu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/585,139

(22) Filed: May 2, 2017

(65) Prior Publication Data

US 2017/0352719 A1 Dec. 7, 2017

Related U.S. Application Data

(60) Provisional application No. 62/344,413, filed on Jun. 2, 2016.

(51) Int. Cl.
| | | |
|---|---|---|
| *H01L 49/02* | (2006.01) | |
| *H01G 4/30* | (2006.01) | |
| *H01G 4/33* | (2006.01) | |
| *H01G 4/38* | (2006.01) | |
| *H01G 4/012* | (2006.01) | |
| *H01G 4/232* | (2006.01) | |
| *H01G 4/10* | (2006.01) | |

(52) U.S. Cl.
CPC ............ *H01L 28/86* (2013.01); *H01G 4/012* (2013.01); *H01G 4/232* (2013.01); *H01G 4/306* (2013.01); *H01G 4/33* (2013.01); *H01G 4/385* (2013.01); *H01G 4/10* (2013.01)

(58) Field of Classification Search
CPC ... H01L 27/0805; H01L 28/86; H01L 27/101; H01L 28/40; H01L 29/408; H01L 2924/1205; H01L 2924/19041; H01L 23/5223–23/5228
See application file for complete search history.

(56) References Cited

U.S. PATENT DOCUMENTS

| | | |
|---|---|---|
| 8,379,365 B2 | 2/2013 | Wang |
| 8,558,346 B1 | 10/2013 | Cheng |
| 2005/0259379 A1 | 11/2005 | Bely |
| 2012/0286394 A1 | 11/2012 | Sutardja |
| 2014/0252546 A1 | 9/2014 | Yen |
| 2015/0054126 A1 | 2/2015 | Cai |

*Primary Examiner* — Cuong B Nguyen
(74) *Attorney, Agent, or Firm* — Winston Hsu

(57) ABSTRACT

A metal-oxide-metal (MOM) capacitor is provided in the present invention. The MOM capacitor includes a capacitor element, wherein the capacitor element includes a first electrode and a second electrode. A projection of the first electrode includes a closed pattern in the vertical projection direction. A projection of the second electrode is surrounded by the closed pattern of the projection of the first electrode in the vertical projection direction.

22 Claims, 12 Drawing Sheets

METAL-OXIDE-METAL CAPACITOR

CROSS REFERENCE TO RELATED APPLICATION

This application claims the benefit of U.S. Provisional Patent Application No. 62/344,413, filed on Jun. 2, 2016.

BACKGROUND

Passive components such as capacitors are extensively used in integrated circuit (IC) design for radio-frequency (RF) and mixed-signal applications, such as bypassing, inter-stage coupling, and in resonant circuits and filters. One of the most commonly used capacitors is the metal-oxide-metal (MOM) capacitor. The MOM capacitor is a common semiconductor capacitor which offers high capacitance density. Manufacturing processes of a MOM capacitor has one mask process reduction than a metal-insulator-metal (MIM) capacitor, and is therefore simpler and more cost effective.

Since the semiconductor industry continues to improve the integration density of electronic components by continual reductions in minimum feature size, it is now difficult to form the metal strips including curved patterns accurately. Therefore, forming a metal strip or a metal frame with a certain curved pattern for isolating another metal strip in each capacitor element in the same metal layer becomes much difficult. Hence, the capacitor elements arranged in an array will interfere with each other and the linearity of the capacitors will be degraded.

SUMMARY

It is therefore one of the objectives of the present invention to provide a metal-oxide-metal (MOM) capacitor with a specific pattern design, so as to overcome the difficulty of accurately forming the metal strips including curved patterns in the advanced semiconductor manufacturing technologies in the prior art, and also to provide good isolation for the capacitor element of the MOM capacitor.

The present invention provides a MOM capacitor that includes a capacitor element, wherein the capacitor element includes a first electrode and a second electrode. A projection of the first electrode includes a closed pattern in the vertical projection direction, and a projection of the second electrode is surrounded by the closed pattern of the projection of the first electrode in the vertical projection direction.

In the MOM capacitor of the present invention, the projection of the second electrode is surrounded by the closed pattern of the projection of the first electrode. Accordingly, each of the capacitor elements can be prevented from being influenced by any other electronic devices, and the linearity of the MOM capacitor can be improved. In addition, the present invention provides a design to form a capacitor element with two patterned conductive layers, wherein each of the patterned conductive layers includes the conductive strips that only extend in one direction. Therefore, the difficulty of precisely forming the metal strips including curved patterns in the same metal layer in the prior art can be resolved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

In the embodiments of the present invention, the term "vertical projection direction" is defined as a direction perpendicular to a plane, such as the surface of the semiconductor chip or the die substrate. The term "projection" of the electrodes or the conductive strips refers to patterns of the electrodes or the conductive strips that are projected in the vertical projection direction to the plane, such as the surface of the semiconductor chip or the die substrate.

For clearly expressing the main features of the embodiments of the present invention, the dielectric material in the metal-oxide-metal (MOM) capacitor is omitted from the drawings of the embodiments. For those ordinary skills in the art of semiconductor manufacturing technologies, it should be understood that the dielectric material is formed between the electrodes or the conductive strips in the same patterned conductive layer for the purpose of isolation, and the dielectric material is also formed between different patterned conductive layers.

Figure 1A:
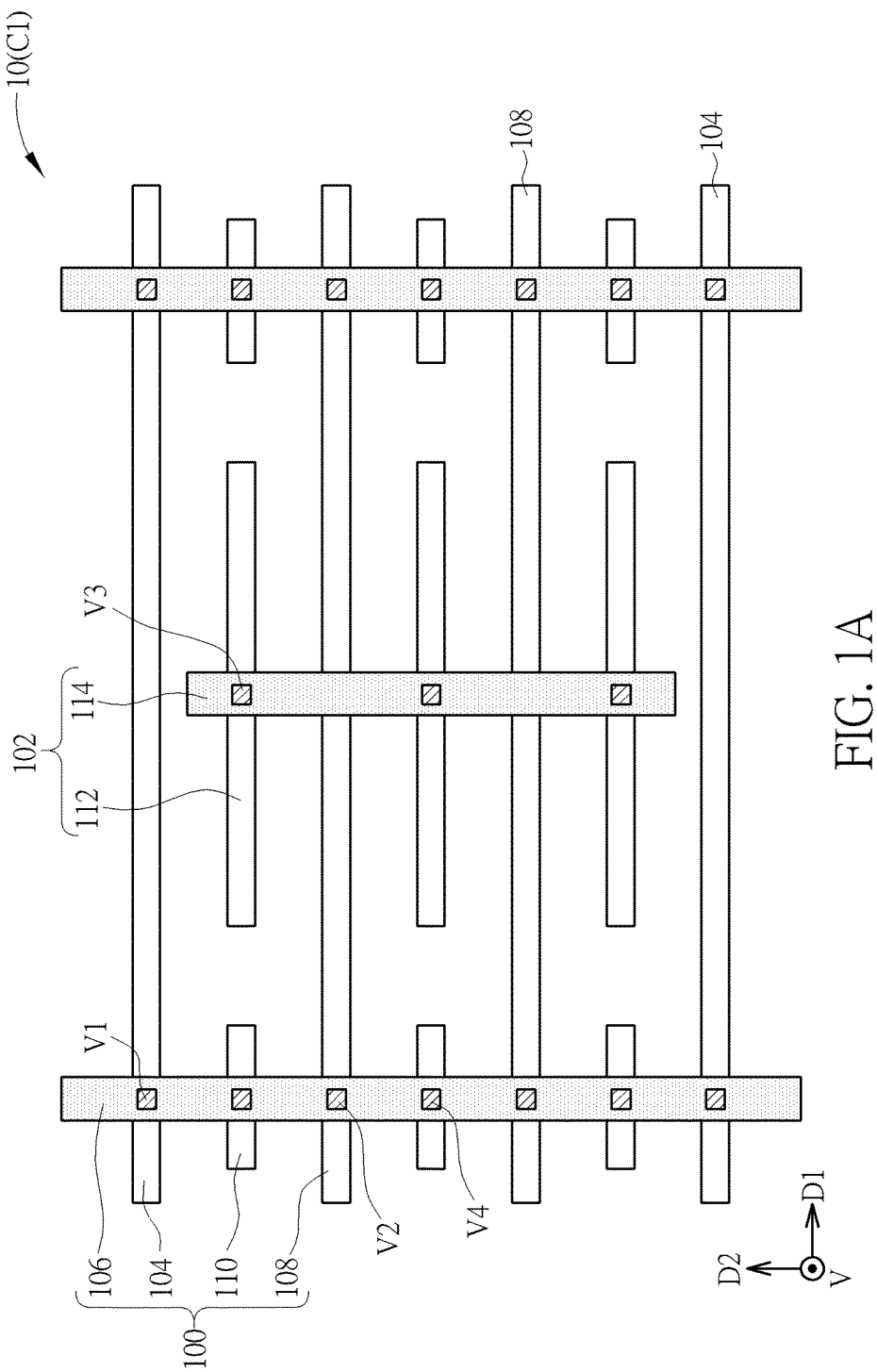
FIG. 1A is a schematic diagram illustrating a top view of a MOM capacitor according to a first embodiment of the present invention.

Referring to FIG. 1A, FIG. 1A is a schematic diagram illustrating a top view of a MOM capacitor according to a first embodiment of the present invention. As shown in FIG. 1A, according to the first embodiment, the MOM capacitor C1 includes a capacitor element 10 formed on a substrate (not shown), such as a substrate of a semiconductor chip or a die. The capacitor element 10 includes a first electrode 100 and a second electrode 102 not electrically connected to the first electrode 100. The first electrode 100 includes a plurality of first conductive strips 104, a plurality of second conductive strips 106, and a plurality of third conductive strips 108 electrically connected to each other. The first electrode 100 of this application further includes a plurality of segmental conductive strips 110. The second electrode 102 includes a plurality of fourth conductive strips 112 and a fifth conductive strip 114 electrically connected to each other. In this embodiment, the first conductive strips 104, the third conductive strips 108, the segmental conductive strips 110, and the fourth conductive strips 112 are extended in a first direction D1 and formed of a first patterned conductive layer. The second conductive strips 106 and the fifth conductive strip 114 are extended in a second direction D2 and formed of a second patterned conductive layer, which is shown with different pattern shadings from the first patterned conductive layer for differentiation. The first direction D1 crosses the second direction D2. In this embodiment, the first direction D1 is perpendicular to the second direction D2, but not limited thereto. The second conductive strips 106 cross the first conductive strips 104, the third conductive strips 108, and the segmental conductive strips 110. Each of the first conductive strips 104 is electrically connected to the second conductive strips 106 through a plurality of first vias V1 respectively, each of the third conductive strips 108 is electrically connected to the second conductive strips 106 through a plurality of second vias V2 respectively, and each of the segmental conductive strips 110 is electrically connected to the second conductive strip 106 through a fourth via V4. Therefore, the first conductive strips 104, the second conductive strips 106, the third conductive strips 108, and the segmental conductive strips 110 are electrically connected together to form the first electrode 100. In another aspect, the fifth conductive strip 114 crosses the fourth conductive strips 112, and each of the fourth conductive strips 112 is electrically connected to the fifth conductive strip 114 through a third via V3, such that the fourth conductive strips 112 and the fifth conductive strip 114 are electrically connected to each other and form the second electrode 102. The material of the conductive strips and vias of this embodiment may include metal, doped layer or other suitable conductive materials. For example, the conductive strips and vias may be formed through conventional dual damascene processes and may include conductive materials, such as W, Al, AlCu, Cu, Ti, TiSi2, Co, CoSi2, Ni, NiSi, TiN, TiW, Ta, or TaN, but not limited thereto.

The patterns of the projection of the first electrode 100 and the projection of the second electrode 102 in a vertical projection direction V is further detailed herein. The vertical projection direction V is perpendicular to both of the first direction D1 and the second direction D2 in this embodiment, and is also perpendicular to the surface of the substrate on which the MOM capacitor C1 disposed. In the vertical projection direction V, the projection of each of the first conductive strips 104 is connected to the projections of two second conductive strips 106, and the projection of each of the second conductive strips 104 is connected to the projections of two first conductive strips 106. Therefore, the projection of the first electrode 100 includes a closed pattern, like a frame, in the vertical projection direction V, which is made of two of the first conductive strips 104 and two of the second conductive strips in the capacitor element 10, and the projection of the second electrode 102 is surrounded by the closed pattern in the vertical projection direction V. In addition, the projection of each of the third conductive strips 108 is connected to the projection of one of the second conductive strips 106. In this embodiment, the projection of each third conductive strip 108 is connected to the projections of two second conductive strips 106. The third conductive strips 108 are disposed between two adjoining first conductive strips 104, and each of the third conductive strips 108 is disposed between two adjoining segmental conductive strips 110 in the second direction D2. In other words, the third conductive strips 108 and the segmental conductive strips 110 are arranged alternately in the second direction D2. The projection of each of the fourth conductive strips 112 is connected to the projection of the fifth conductive strip 114, and the fourth conductive strips 112 and the third conductive strips 108 are disposed alternately in the second direction D2. Furthermore, each of the fourth conductive strips 112 is disposed between two of the segmental conductive strips 110 in the first direction D1, and the segmental conductive strips 110 and the fourth conductive strips 112 disposed therebetween are substantially aligned along the first direction D1. However, it should be noted that the segmental conductive strips 110 are isolated from the fourth conductive strips 112 by a dielectric material (not shown). The fifth conductive strip 114 is disposed between two of the second conductive strips 106 in the first direction D1. In addition, the projection of the fifth conductive strip 114 crosses the projections of third conductive strips 108, and the fifth conductive strip 114 is isolated from the third conductive strips 108 by the dielectric material (not shown).

In this embodiment, the first electrode 100 is a top electrode of the capacitor element 10, and the second electrode 102 is a bottom electrode of the capacitor element 10. Therefore, the first electrode 100 may be grounded or serves as an output terminal, and the second electrode 102 serves as an input terminal and may be electrically connected to an electronic device, such as a transistor, but not limited thereto.

According to this embodiment, the capacitor element 10 is formed of two different patterned conductive layers, wherein the first patterned conductive layer includes the conductive strips that extend in the first direction D1, and the second patterned conductive layer includes the conductive strips that extend in the second direction D2. No curved lines or strips are formed in the first and second patterned conductive layers, and the strips in the different two patterned conductive layer of the same electrode are electrically connected through vias disposed between the patterned conductive layers. Therefore, the design of this embodiment can overcome the difficulty of perfectly forming the metal strips including curved patterns in the same metal layer in the advanced semiconductor manufacturing technologies. For example, since the patterns of the first conductive strips 104, the third conductive strips 108, and the second conductive strips 112 and the segmental conductive strips 110 are straight lines along the first direction D1, it is easy to form these patterns through a lithography process even if in a dense pattern application. In addition, the design that closed pattern of the projection of the first electrode 100 surrounds the projection of the second electrode 102 means that the first electrode 100 (top electrode) substantially isolates the second electrode 102 from other electronic devices disposed nearby. For example, the second electrode 102 is sandwiched in between two first conductive strips 104 so as to provide the isolation for the second electrode 102 in the second direction D2, and the second electrode 102 is sandwiched in between the two second conductive strips 106 so as to provide the isolation for the second electrode 102 in the first direction D1. Furthermore, in order to provide a complete isolation to the fourth conductive strips 112 of the second electrode 102 (bottom electrode) in the first direction D1, the segmental conductive strips 110 formed of the same patterned conductive layer as the fourth conductive strips 112 are placed in the capacitor element 10 for effectively preventing the fourth conductive strips 112 from being interfered with other electronic devices around the capacitor element 10, especially in the first direction D1. Furthermore, since the third conductive strips 108 and the fifth conductive strip 114 are formed of different patterned conductive layers, the third conductive strips 108 can cross the fifth conductive strip 114 without electrical connection. Therefore, the third conductive strips 108 is no longer required to be disconnected due to the existence of the fifth conductive strip 114, and the third conductive strips 108 can extend along the first direction D1 between two second conductive strips 106 and have a larger area. Thus, the capacity between the first electrode 100 and the second electrode 102 is improved. It is noteworthy that the stacking sequence is not specifically limited. For example, the second patterned conductive layer may be formed above the first patterned conductive layer along the vertical projection direction V, but the inverse disposition may also be included in this embodiment.

It should be noted that the amounts and relative lengths of the first conductive strips 104, the second conductive strips 106, the third conductive strips 108, the fourth conductive strips 112, and the fifth conductive strip 114 are limited to the example shown in FIG. 1A. For example, in one variant embodiment, the first electrode 100 may include four or more second conductive strips 106, and the second electrode 102 may also include two or more fifth conductive strips 114 arranged side by side in the first direction. In addition, the first conductive strips 104 and the third conductive strips 108 may have non-identical length.

In another variant embodiment, the MOM capacitor may include a plurality of capacitor elements 10 stacked in sequence along the vertical projection direction V. Each of the capacitor elements 10 is formed of two patterned conductive layers that are different from the patterned conductive layers of other the capacitor elements 10. In addition, the first electrodes 100 of the capacitor elements 10 may be electrically connected to each other through vias (not shown), and the second electrodes 102 of the capacitor elements 10 may be electrically connected to each other through other vias (not shown). In short, the MOM capacitor in the variant embodiment includes a plurality of capacitor elements 10 formed of two patterned conductive layers shown in FIG. 1 stacked in the vertical projection direction V in sequence, wherein the first electrodes 100 in all the capacitor elements 10 are electrically connected to each other through vias, and the second electrodes 102 in all the capacitor elements 10 are electrically connected to each other through vias.

Figure 1B:
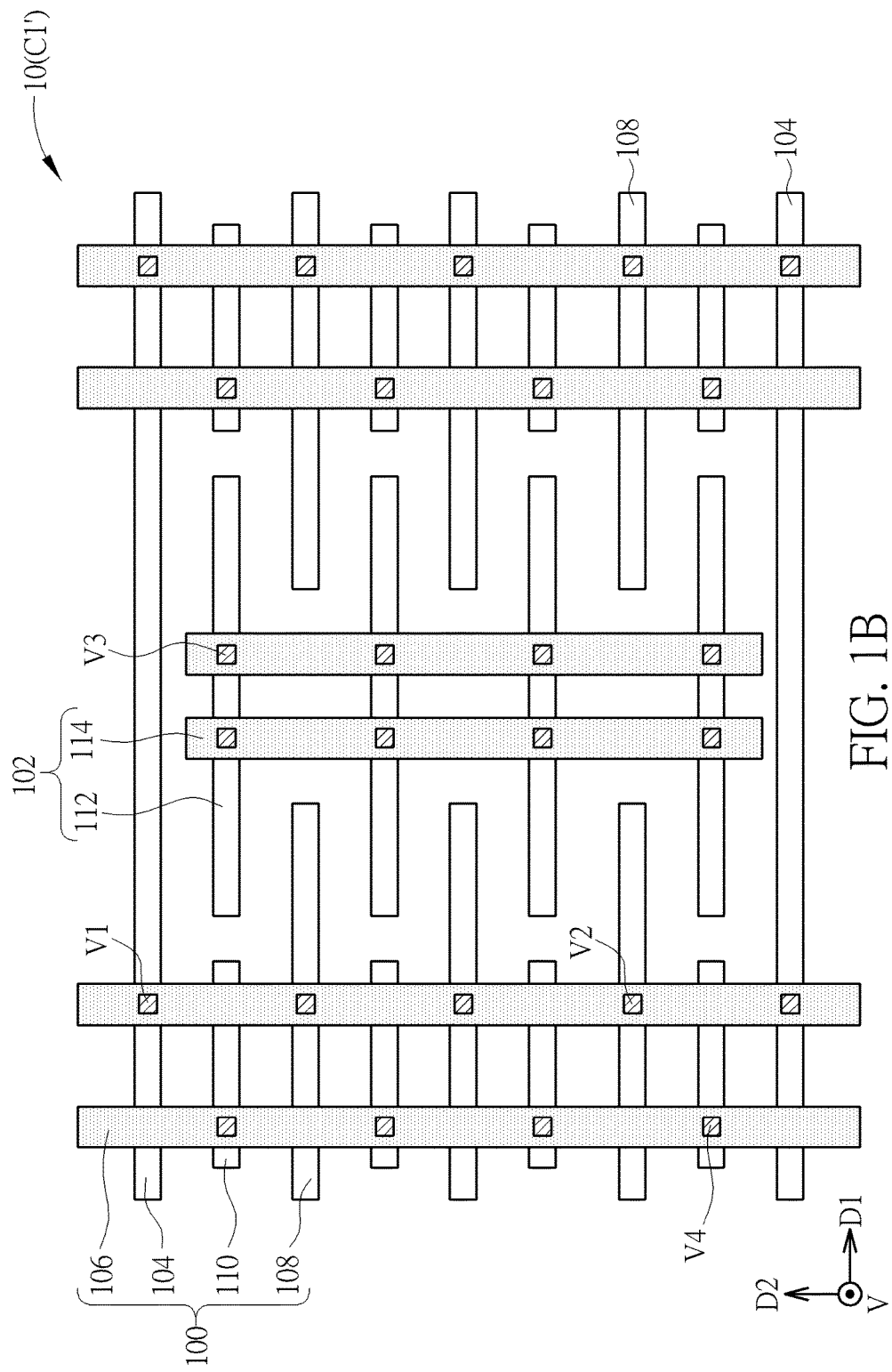
FIG. 1B is a schematic diagram illustrating a top view of a MOM capacitor according to a variant embodiment of the first embodiment of the present invention.

Referring to FIG. 1B, FIG. 1B is a schematic diagram illustrating a top view of a MOM capacitor according to a variant embodiment of the first embodiment of the present invention. The MOM capacitor C1' of this variant embodiment is mainly different from the first embodiment in the arrangement of the third conductive strips 108 and the numbers of some conductive strips. In this variant embodiment, the third conductive strips 108 are shorter and does not cross the second conductive strips 106 at different sides of the fifth conductive strip 114 in the projection direction at the same time. In other words, the projection of each third conductive strip 108 only crosses the projection(s) of the second conductive strip(s) 106 at one side (or the same side) of the fifth conductive strips 114 in the vertical projection direction V. In addition, the first electrode 100 includes four second conductive strips 106, two of which are positioned at the left side of the fifth conductive strips 114 while the other two are positioned at the right side of the fifth conductive strips 114, and the second electrode 102 may also include two or more fifth conductive strips 114 arranged side by side in the first direction. Furthermore, the numbers of the third conductive strips 108, the fourth conductive strips 112, and the segmental conductive strips 110 of the MOM capacitor C1' in this variant embodiment are greater than those of the MOM capacitor C1 in the first embodiment. In another aspect, the first conductive strips 104 may have a longer length than the third conductive strips 108 which are sandwiched between the two first conductive strips 104. Furthermore, in another variant embodiment, the amounts of the second conductive strips 106 and the fifth conductive strip 114 may be identical to the first embodiment, but each third conductive strip 108 does not cross the fifth conductive strip 114 and only crosses one second conductive strip 106 at one side of the fifth conductive strip 114 in the vertical projection direction V.

The following description will detail other embodiments of the present invention. To simplify the description, identical components in each of the following embodiments are marked with identical symbols. For making it easier to understand the differences between the embodiments, the following description will detail the dissimilarities among different embodiments and the identical portions will not be redundantly described.

Figure 2:
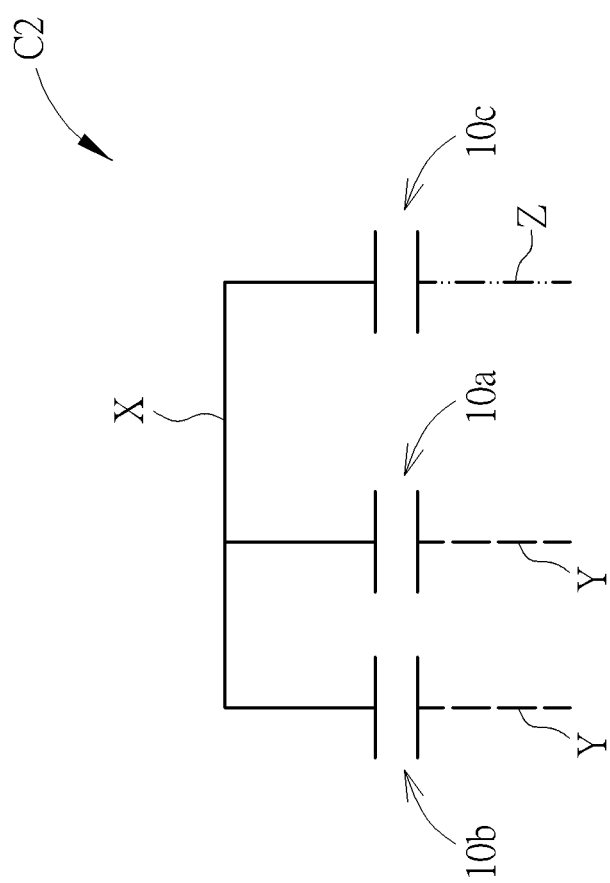
FIG. 2 is an equivalent circuit diagram of a MOM capacitor according to a second embodiment of the present invention.
Figure 3:
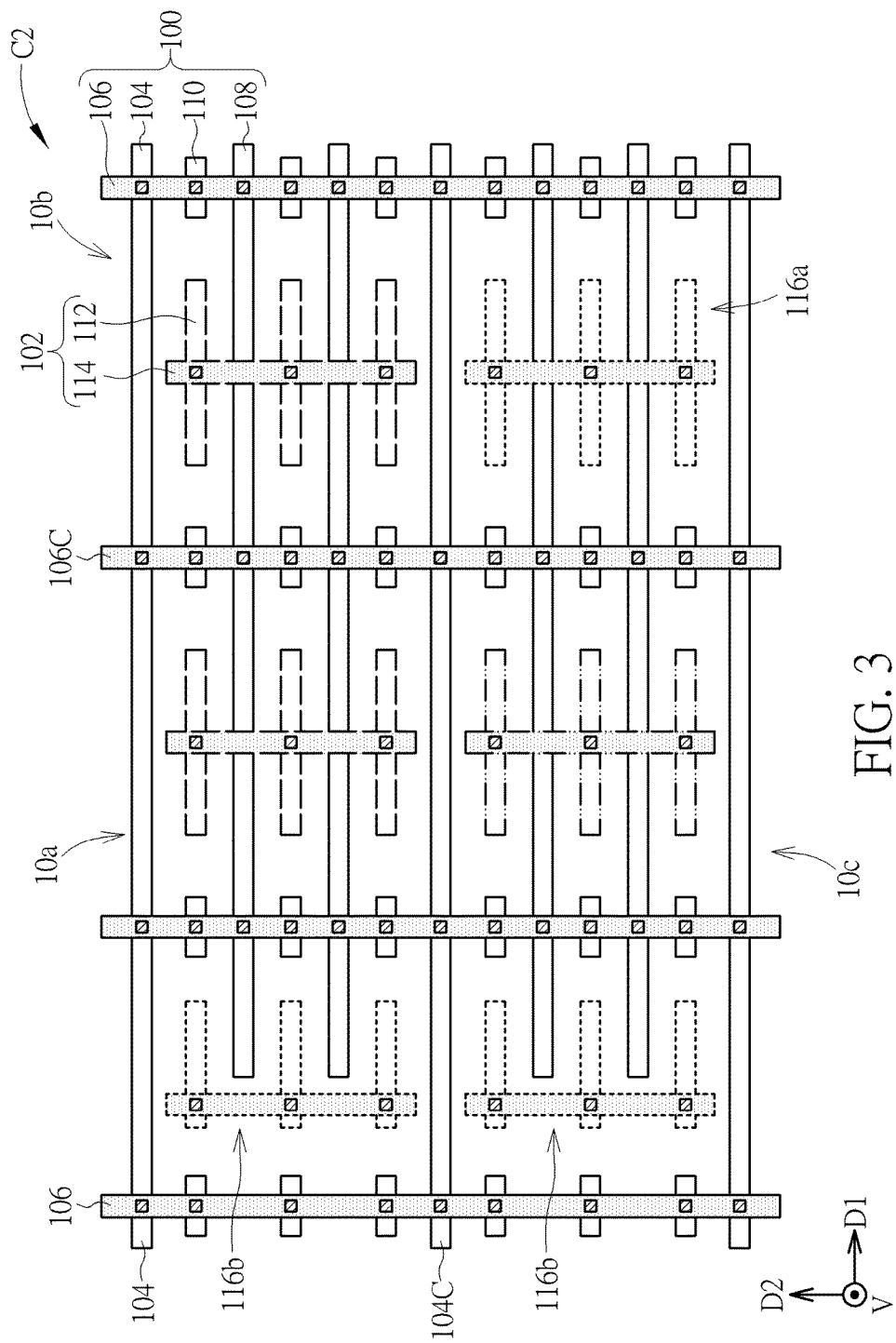
FIG. 3 is a schematic diagram illustrating a top view of the first and second patterned conductive layers of the MOM capacitor according to the second embodiment of the present invention.
Figure 4:
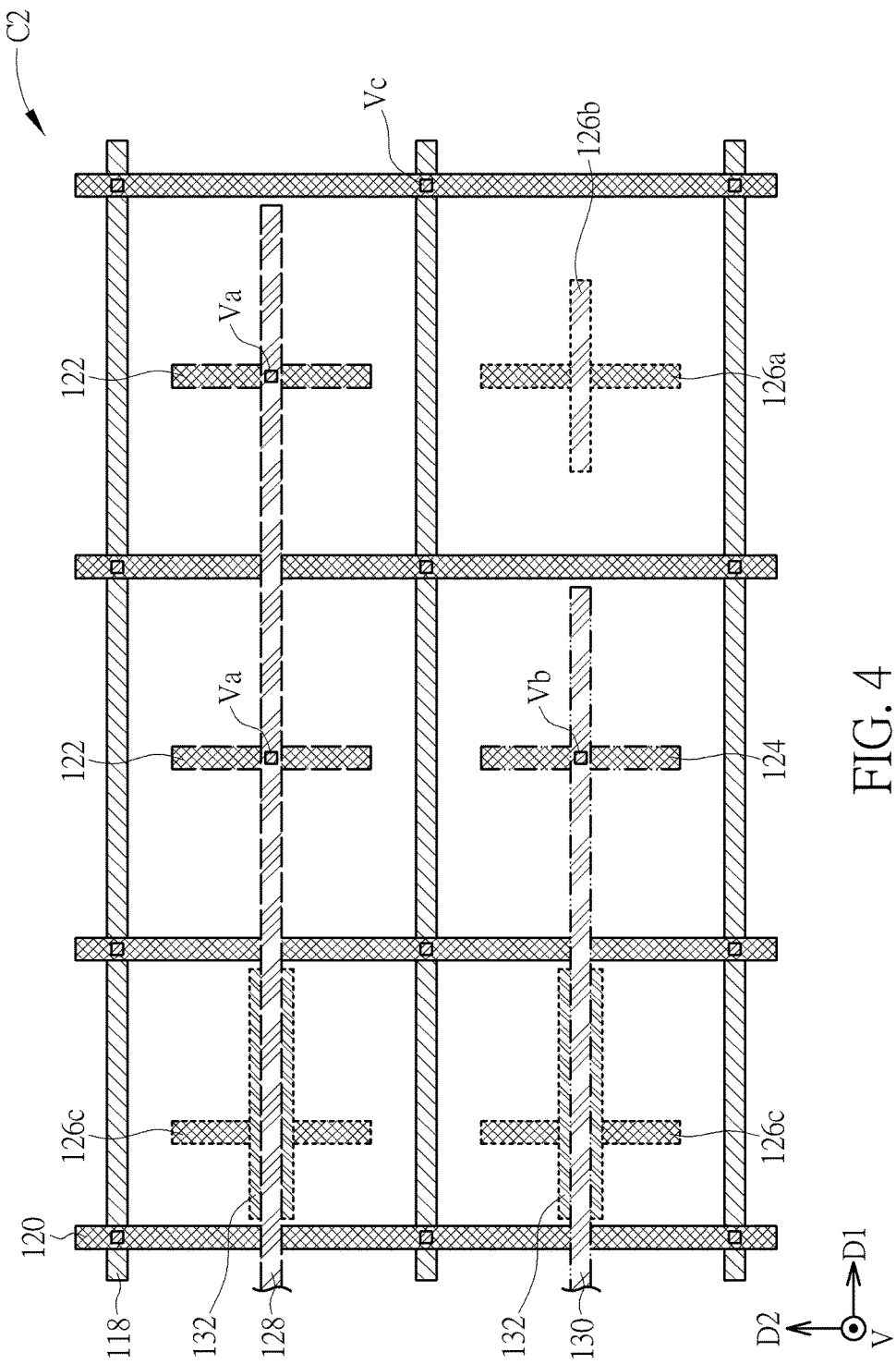
FIG. 4 is a schematic diagram illustrating a layout of other patterned conductive layers of the MOM capacitor according to a second embodiment of the present invention.

FIG. 2 to FIG. 4 are figures illustrating a MOM capacitor according to a second embodiment of this application, wherein FIG. 2 is an equivalent circuit diagram of the MOM capacitor according to the second embodiment of the present invention, FIG. 3 is a schematic diagram illustrating a top view of the first and second patterned conductive layers of the MOM capacitor according to the second embodiment of the present invention, and FIG. 4 is a schematic diagram illustrating a layout of other patterned conductive layers of the MOM capacitor according to the second embodiment of the present invention. Referring to FIG. 4, the MOM capacitor C2 of this application includes three capacitor elements 10a, 10b, 10c. The top electrodes of the capacitor elements 10a, 10b, 10c are electrically connected together as a common terminal X that is grounded or serves as an output terminal. The bottom electrodes of the capacitor elements 10a, 10b serve as input terminals Y, the bottom electrode of the capacitor element 10c serves as another input terminal Z, and the input terminals Y, Z may be electrically connected to external electronic devices respectively, such as transistors, but not limited thereto. In FIG. 4, the top electrodes and the bottom electrodes of the capacitor elements 10a, 10b, 10c are represented with different line patterns or line segments respectively in order to reveal the electric connection relationship. Specifically, the top electrodes (marked with "X") of the capacitor elements 10a, 10b, 10c are illustrated in solid lines, the bottom electrodes (marked with "Y") of the capacitor elements 10a, 10b are illustrated in broken lines, and the capacitor element 10c (marked with "Z") is illustrated in broken lines with two dots between two segments. These line patterns are also shown in FIG. 3 and FIG. 4 for clearly illustrating the arrangements of the capacitor elements 10a, 10b, 10c.

As shown in FIG. 3, the MOM capacitor C2 of this embodiment includes a plurality of capacitor elements 10a, 10b, 10c and a dummy electrode 116a (shown in dotted lines) arranged in juxtaposition. The capacitor elements 10a, 10b, 10c and the capacitor element 10 in the first embodiment have similar top-view layouts, except that the adjoining capacitor elements 10a, 10b, 10c have a common first conductive strip 104C or a common second conductive strip 106C, and the projection or structure of the dummy electrode 116a is substantially the same as that of the second electrode 102 shown in FIG. 1A. Therefore, the capacitor elements 10a, 10b, 10c are formed of two patterned conductive layers, wherein the first conductive strips 104, the third conductive strips 108, the segmental conductive strips 110, and the fourth conductive strips 112 are formed of a same first patterned conductive layer, and the second conductive strips 106 and the fifth conductive strips 114 are formed of a same second patterned conductive layer, as mentioned in the first embodiment. In the vertical projection direction V, the projection of two of the first conductive strips 104 and the projection of two of the second conductive strips 106 in each of the capacitor elements 10a, 10b, 10c form the closed pattern, and the closed pattern of the capacitor element 10a is connected to the closed pattern of the capacitor element 10b in the first direction D1 and the closed pattern of the capacitor element 10c in the second direction D2. As shown in FIG. 3, the projection of each first conductive strip 104 is connected to the projection of two or more second conductive strips 106 and the projection of each second conductive strip 106 is connected to the projection of two or more first conductive strips 106, so as to form the closed patterns. In addition, the capacitor element 10a and the capacitor element 10b are arranged in a line along the first direction D1, and the capacitor element 10a and the capacitor element 10b have a common second conductive strip 106C. The capacitor element 10a and the capacitor element 10c are arranged in a line along the second direction D2, and the capacitor element 10a and the capacitor element 10c have a common first conductive strip 104C. Accordingly, the closed patterns of the first electrodes 100 of the capacitor elements 10a, 10b, 10c are electrically connected together, as the common top electrode, which is the common terminal X shown in FIG. 2 and may be grounded or be an output terminal. The second electrodes 102 of the capacitor elements 10a and 10b and the second electrode 102 of the capacitor elements 10c are respectively serve as the bottom electrodes, the input terminals Y and Z in FIG. 2, and are separated from each other by the first electrodes 100 in FIG. 3.

In addition, the MOM capacitor C2 further includes two optional dummy electrodes 116b adjacent to the capacitor elements 10a and 10c respectively. The constitution of the dummy electrodes 116b, and the dummy electrode 116a are similar, wherein the difference between the dummy electrode 116a and the dummy electrode 116b is that the projection of each dummy electrodes 116b has a pattern similar to the letter "E". In order to isolate the dummy electrodes 116a and 116b, they are all surrounded by the first electrodes 100. Specifically, three first conductive strips 104 cross four second conductive strips 106, with electrical connection, to create six closed patterns of the first electrodes 100 in this embodiment. The closed patterns are arranged in a 2×3 matrix, wherein the capacitor element 10a and the capacitor element 10c are disposed in the first row and the second row of the second column respectively, the capacitor element 10b and the dummy electrode 116a are disposed in the first row and the second row of the third column respectively, and the dummy electrodes 116b are disposed within the closed patterns in the first row and the second row of the first column respectively. In this embodiment, all of the first conductive strips 104, the second conductive strips 106, the third conductive strips 108, and the segmental conductive strips 110 are electrically connected together, and therefore the six closed patterns can also be regarded as one common first electrode 100. As mentioned above, the second electrodes 102 of the capacitor elements 10a, 10b, 10c are respectively disposed in the corresponding closed patterns of the common first electrodes 100, each of which is shielded by the corresponding closed pattern of the common first electrode 100, and therefore the capacitor elements 10a, 10b, 10c are prevented from being influenced by each other or any other adjacent external electronic device. Especially, when the common first electrode 100 has the segment conductive strips 110, it can provide good isolation effect for the second electrodes 102 of the capacitor elements 10a, 10b, 10c, as well as the dummy electrodes 116a and 116b. The constitution and materials of the first electrodes 100 and the second electrode 102 are the same as the first embodiment, and will not be redundantly described herein.

It should be noted that the structure and layout described above and depicted in FIG. 3 may be repeatedly stacked in sequence along the vertical projection direction V. For example, The MOM capacitor C2 may include a plurality of capacitor elements 10a stacked in sequence along the vertical projection direction V, each of the capacitor elements 10a is formed of two patterned conductive layers different from any patterned conductive layers of any other one of the capacitor elements 10a, the first electrodes 100 of the capacitor elements 10a are electrically connected to each other through vias (not shown), and the second electrodes 102 of the capacitor elements 10a are electrically connected to each other through vias (not shown). In addition, the method of integrating a plurality of capacitor elements 10b and the method of integrating a plurality of capacitor elements 10c may be the same as that of the capacitor elements 10a, thus detailed description will not be redundantly repeated.

FIG. 4 illustrates other four patterned conductive layers of the MOM capacitor C2, which may be stacked above the first and second pattern conductive layers shown in FIG. 3 along the vertical projection direction V. As shown in FIG. 4, in the vertical projection direction V, the MOM capacitor C2 includes a plurality of first shielding strips 118 disposed corresponding to the first conductive strips 104, a plurality of second shielding strips 120 disposed corresponding to the second conductive strips 106, two first auxiliary strips 122 disposed corresponding to the fifth conductive strips 114 of the capacitor elements 10a, 10b respectively, a second auxiliary strip 124 disposed corresponding to the fifth conductive strip 114 of the capacitor element 10c, a dummy strip 126a and a dummy strip 126b disposed corresponding to the dummy electrode 116a, and two of the dummy strips 126c disposed corresponding to the dummy electrodes 116b. In addition, the MOM capacitor C2 further includes a first bridge line 128 crossing two first auxiliary strips 122 and the dummy strip 126c in the vertical projection direction V, and a second bridge line 130 crossing the second auxiliary strip 124 and the dummy strip 126c in the vertical projection direction V. In this embodiment, the first shielding strips 118 extend in the first direction D1 and are formed of a third patterned conductive layer, and the second shielding strips 120, the first auxiliary strips 122, the second auxiliary strip 124, and the dummy strips 126a, 126c all extend in the second direction D2, and they are all formed of a same fourth patterned conductive layer. Furthermore, the first bridge line 128, the second bridge line 130, and the dummy strip 126b extend in the first direction D1, and they are formed of a same fifth patterned conductive layer. For example, the fourth patterned conductive layer is disposed between the third patterned conductive layer and the fifth patterned conductive layer, and the fifth patterned conductive layer is disposed above the third patterned conductive layer in the vertical projection direction V. In addition, a plurality of third shielding strips 132 may be disposed corresponding to the dummy electrodes 116b and extend in the first direction D1. The third shielding strips 132 are formed of a sixth patterned conductive layer, and the sixth patterned conductive layer is disposed between the fifth patterned conductive layer and the fourth patterned conductive layer in the vertical projection direction V.

In addition, each first auxiliary strip 122 is electrically connected to the corresponding second electrode 102 of the capacitor element 10a or 10b through a via (not shown) respectively, and the first bridge line 128 is electrically connected to both of the first auxiliary strips 122 through a plurality of vias Va respectively. Therefore, the second electrodes 102, i.e. the bottom electrodes, of the capacitor elements 10a, 10b can both be electrically connected to the first bridge line 128. In another aspect, the second auxiliary strip 124 may be electrically connected to the corresponding second electrode 102 of the capacitor elements 10c through a via (not shown), and the second bridge line 130 is electrically connected to the second auxiliary strip 124 through a via Vb. Therefore, the second electrode 102, i.e. the bottom electrode, of the capacitor element 10c can be electrically connected to the second bridge line 130. The first bridge line 128 and the second bridge line 130 may further extend leftward to be electrically connected to electronic devices, such as transistors, but not limited thereto, such that they serve as input terminals for inputting signals or voltages to the bottom electrodes of the capacitor elements 10a, 10b, 10c respectively. Furthermore, the first shielding strips 118 and the second shielding strips 120 are electrically connected together through the vias Vc. It is noteworthy that the projection of the first shielding strips 118 and the second shielding strips 120 also form a plurality of closed patterns that surround the first auxiliary strips 122, the second auxiliary strip 122, the dummy strips 126a, 126b, 126c, thus they can further prevent the first electrodes 100 and the second electrodes 102 of the first patterned conductive layer and the second patterned conductive layer from being influenced by the other electronic components disposed at the higher levels of the patterned conductive layer. Moreover, the disposition of the third shielding strips 132 formed of the sixth patterned conductive layer prevents the coupling between the dummy strip 126c and the first bridge line 128, and the coupling between the dummy strip 126c and the second bridge line 130.

Figure 5:
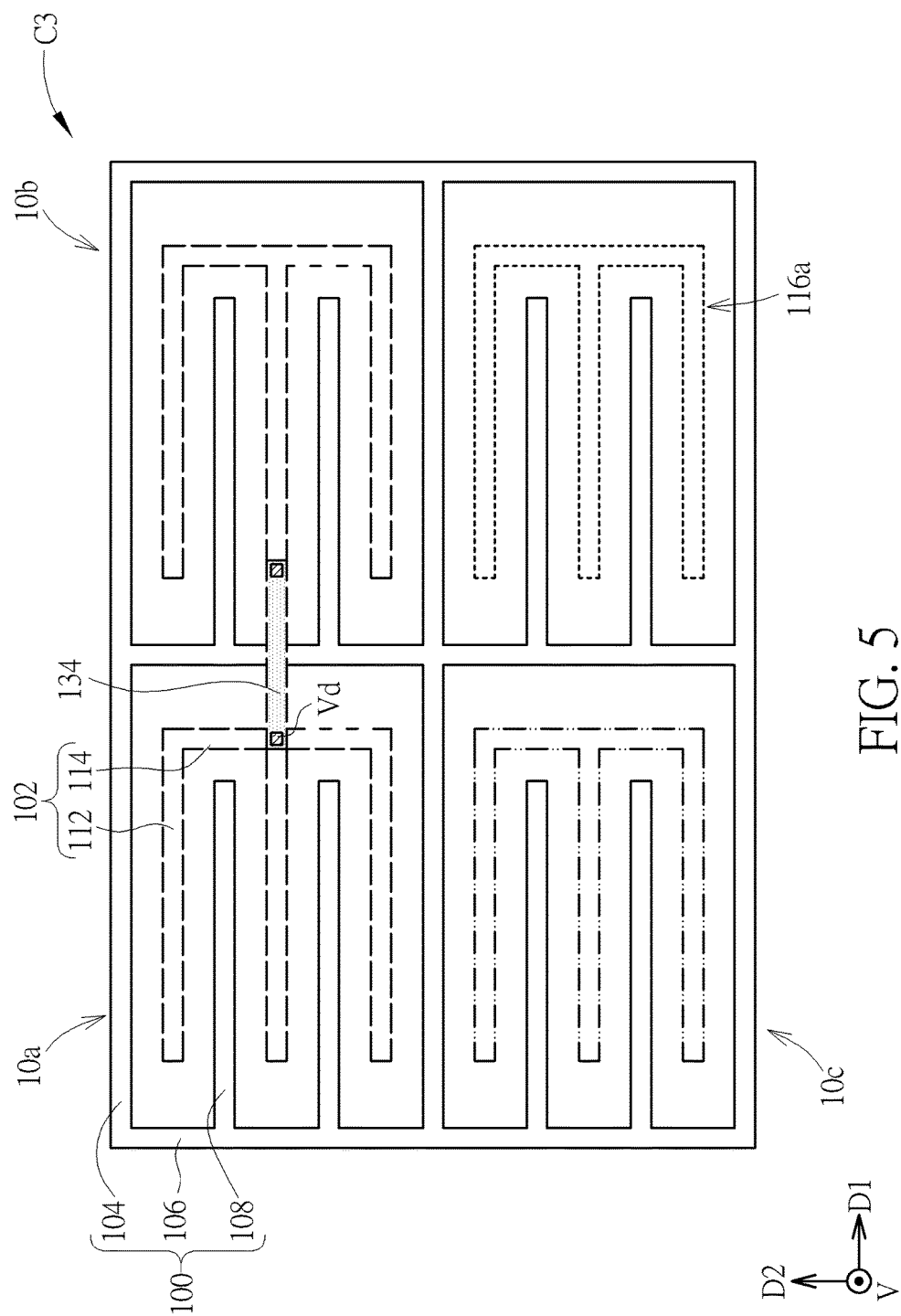
FIG. 5 is a schematic diagram illustrating a top view of a MOM capacitor according to a third embodiment of the present invention.

Referring to FIG. 5, FIG. 5 is a schematic diagram illustrating a top view of a MOM capacitor according to a third embodiment of the present invention. As shown in FIG. 5, the MOM capacitor C3 of this embodiment includes three capacitor elements 10a, 10b, 10c, whose equivalent circuit is the same as the second embodiment shown in FIG. 2. Therefore, the second electrodes 102 of the capacitor elements 10a and 10b are electrically connected together, but not electrically connected to the second electrode 102 of the capacitor element 10c, and the first electrodes 100 of all the three capacitor elements 10a, 10b, 10c are electrically connected together. However, the MOM capacitor C3 has only one dummy electrode 116a, without the dummy electrodes 116b shown in FIG. 3, but not limited thereto. In this embodiment, the capacitor elements 10a, 10b, 10c and the dummy electrode 116a are formed of the same patterned conductive layer. Three first conductive strips 104 cross three second conductive strips 106 to create four closed patterns and form the common first electrode 100, i.e. the common top electrode, of the capacitor elements 10a, 10b, 10c. The capacitor element 10a and the capacitor element 10c are disposed in the first row and the second row of the first column respectively, and the capacitor element 10b and the dummy electrode 116a are disposed in the first row and the second row of the second column respectively. Therefore, the second electrodes 102 of three capacitor elements 10a, 10b, 10c and the dummy electrode 116a are surrounded by the first electrodes 100 to avoid interference with external electronic devices. It is noteworthy that the projection patterns of the second electrodes 102 and the first electrodes 100 of the capacitor elements 10a, 10b, 10c in this embodiment are different from that of the second embodiment. Each of the third conductive strips 108 is connected to only one of the second conductive strips 106, and the third conductive strips 108 do not cross the fifth conductive strip 114 in each of the closed patterns. Furthermore, each of the fourth conductive strips 112 is connected to the fifth conductive strip 114 of the same second electrode 102, so as to form a pattern similar to the digital number of "3". In each of the capacitor elements 10a, 10b, 10c, the fourth conductive strips 112 and the third conductive strips 108 are interdigitated in the second direction D2 and separated from one another. In addition, the dummy electrode 116a has the same pattern as the second electrodes 102 of the capacitor elements 10a, 10b, 10c, and therefore the strips extending along the first direction D1 of the dummy electrode 116a and the third conductive strips 108 of the first electrode 100 in the lower right closed pattern are also interdigitated.

According to this embodiment, since the first electrodes 100 and the second electrodes 102 are formed of the same patterned conductive layer, such as a first patterned conductive layer, abridge line 134 made of another patterned conductive layer, such as a second patterned conductive layer, is used for electrically connecting the second electrodes 102 of the capacitor element 10a and the capacitor element 10b. For example, two opposite ends of the bridge line 134 are electrically connected to the fifth conductive strip 114 of the capacitor element 10a and the fourth conductive strips 112 of the capacitor element 10b through vias Vd respectively, but not limited thereto. In addition, the first electrodes 100 are grounded or serve as output terminals, and the second electrodes 102 serve as input terminals, thus the second electrodes 102 or the bridge line 134 may be further electrically connected to another conductive line (not shown) for inputting signals or voltages. Furthermore, since each of the second electrodes 102 is disposed in the corresponding closed pattern of the first electrode 100 made of the same patterned conductive layer, the second electrodes 102 are prevented from being influenced by each other or by other adjacent external electronic devices, and the design of the segmental conductive strips 110 mentioned in the first or second embodiments is not adopted in this embodiment.

Figure 6:
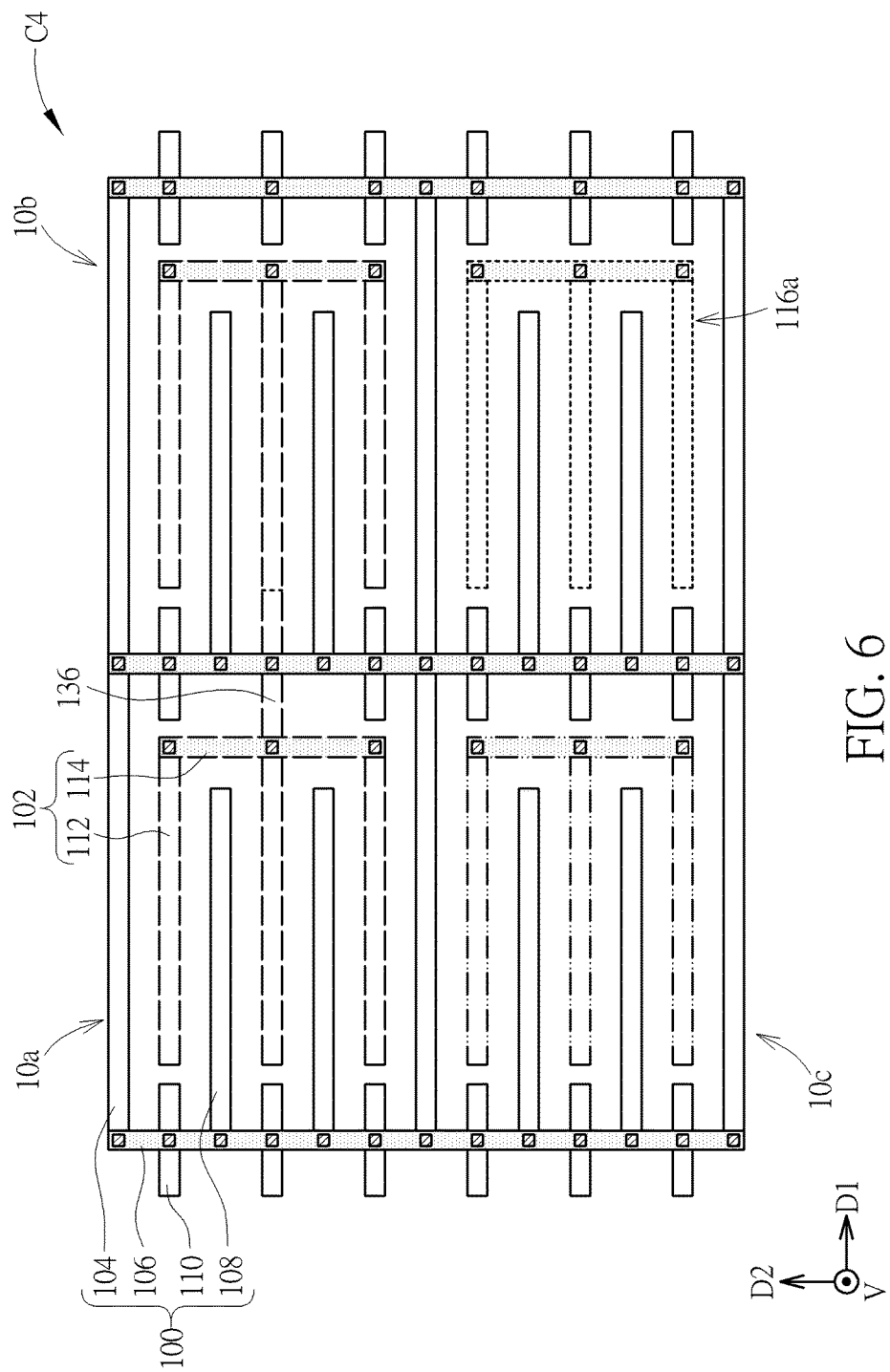
FIG. 6 is a schematic diagram illustrating a top view of a MOM capacitor according to a fourth embodiment of the present invention.

Referring to FIG. 6, FIG. 6 is a schematic diagram illustrating a top view of a MOM capacitor according to a fourth embodiment of the present invention. As shown in FIG. 6, the difference between the MOM capacitor C4 of this embodiment and the MOM capacitor C3 of the third embodiment is that the first conductive strips 104, the third conductive strips 108, and the fourth conductive strips 112 are formed of the same patterned conductive layer, such as a first patterned conductive layer, and the second conductive strips 106 and the fifth conductive strips 114 are formed of another patterned conductive layer, such as a second patterned conductive layer. In addition, the MOM capacitor C4 includes a bridge line 136 extending in the first direction D1 and directly connected to one of the fourth conductive strips 112 of the capacitor elements 10a and one of the fourth conductive strips 112 of the capacitor elements 10b. The bridge line 136 is formed of the same patterned conductive layer as the fourth conductive strips 112, such as the first patterned conductive layer. Specifically, the bridge line 136 and two connected fourth conductive strips 112 are formed of the same conductive line extending from the capacitor element 10a to the capacitor element 10b in the first direction D1. However, the bridge line 136 may be formed of another patterned conductive layer that is different from the first patterned conductive layer and the second patterned conductive layer in a variant embodiment. Furthermore, the design of the segmental conductive strips 110 is adopted in this embodiment, wherein the segmental conductive strips 110 are formed of the same patterned conductive layer as the fourth conductive strips 112, such as the first patterned conductive layer. The segmental conductive strips 110 are part of the first electrodes 100, and the first electrodes 100 may be grounded for example. Therefore, the fourth conductive strips 112 of the second electrodes 102 of the capacitor elements 10a, 10b, 10c can be effectively isolated from other adjacent electronic devices in the first direction D1. The method of electrically connecting the second conductive strips 106 to the first conductive strips 104, the third conductive strips 108, and the segmental conductive strips 110, and the method of electrically connecting the fourth conductive strips 112 to the fifth conductive strips 114 are the same as the first embodiment. In addition, the equivalent circuit diagram in FIG. 2 may also be applied to the MOM capacitor C4 in this embodiment.

Figure 7:
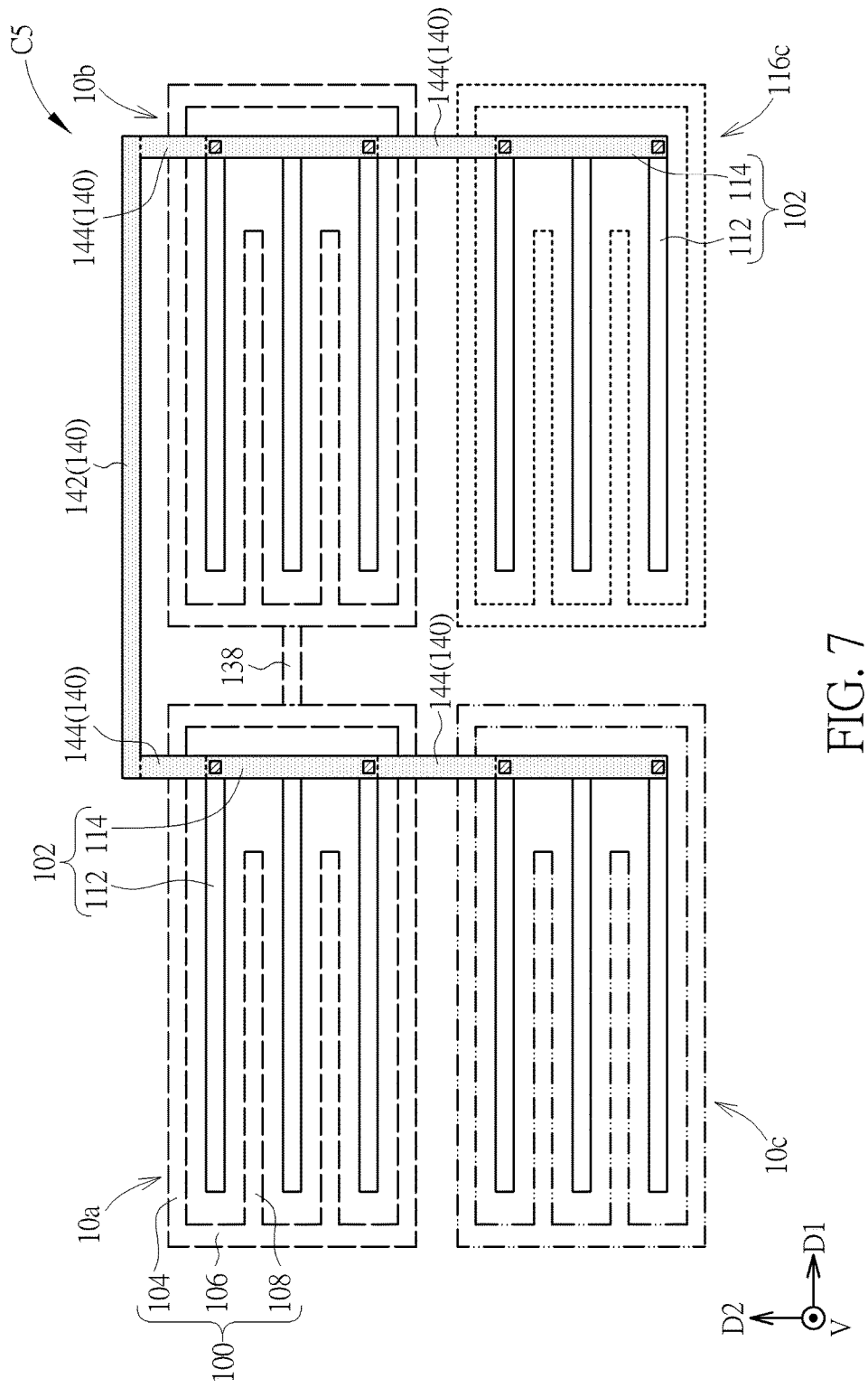
FIG. 7 is a schematic diagram illustrating a top view of a MOM capacitor according to a fifth embodiment of the present invention.

Referring to FIG. 7, FIG. 7 is a schematic diagram illustrating a top view of a MOM capacitor according to a fifth embodiment of the present invention. In this embodiment, the equivalent circuit of the MOM capacitor C5 of this embodiment is the same as that of the second embodiment shown in FIG. 2. As shown in FIG. 7, the difference between the MOM capacitor C5 of this embodiment and the MOM capacitor C3 of the third embodiment is that the first electrodes 100 of the capacitor elements 10a, 10b, 10c are separated from one another, and the first electrodes 100 and the second electrodes 102 respectively serve as the bottom electrodes and the top electrodes of the capacitor elements 10a, 10b, 10c. Specifically, the projection of two first conductive strips 104 and two second conductive strips 106 of the first electrode 100 in each of the capacitor elements 10a, 10b, 10c form a closed pattern, and the closed pattern of one of the capacitor elements 10a, 10b, 10c is separated from the closed pattern of any other one of the capacitor elements 10a, 10b, 10c in the vertical projection direction V. However, a connection line 138 is used for electrically connecting the first electrode 100 of the capacitor element 10a and the first electrode 100 of the capacitor element 10b, so as to electrically connect the bottom electrodes of the capacitor elements 10a and 10b for providing a common input terminal Y shown in FIG. 2, while the first electrode 100 of the capacitor element 10c serves as a separate input terminal z. The connection line 138 of this embodiment is formed of the same patterned conductive layer as the second conductive trips 106, but not limited thereto. For example, one end of the connection line 138 is directly connected to the right second conductive strip 106 of the capacitor element 10a that is adjoining to the capacitor element 10b, and another end of the connection line 138 is directly connected to the left second conductive strip 106 of the capacitor element 10b that is adjoining to the capacitor element 10a. In this embodiment, the MOM capacitor C5 further includes a dummy electrode 116c arranged in juxtaposition with the capacitor elements 10a, 10b, 10c. A projection of the dummy electrode 116c is substantially the same as the projection of the first electrodes 100, and therefore the dummy electrode 116c also has a closed pattern that surrounds a second electrode 102.

In this embodiment, the first conductive strips 104, the second conductive strips 106, the third conductive strips 108, and the fourth conductive strips 112 of the capacitor elements 10a, 10b, 10c, the dummy electrode 116c, and the connection line 138 are formed of the same patterned conductive layer, such as a first patterned conductive layer. The fifth conductive strips 114 and a bridge line 140 are formed of another patterned conductive layer, such as a second patterned conductive layer. The bridge line 140 is directly connected to the fifth conductive strips 114 of the capacitor elements 10a, 10b, 10c and the fifth conductive strip 114 surrounded by the dummy electrode 116c in order to electrically connect all the second electrodes 102 to form a common top electrode serving as a common output terminal X shown in FIG. 2 or being grounded. For example, the bridge line 140 includes a first bridge strip 142 and a plurality of second bridge strips 144. The first bridge strip 142 extends in the first direction D1 and is disposed outside the closed patterns. The second bridge strips 144 extend in the second direction D2 and are disposed between the first bridge strip 142 and the fifth conductive strips 114 of the capacitor element 10a and the capacitor element 10b respectively. The second bridge strips 144 are also disposed between the fifth conductive strips 114 of the capacitor element 10a and the capacitor element 10c and disposed between the fifth conductive strip 114 of the capacitor element 10b and the fifth conductive strip 114 surrounded by the dummy electrode 116c. In addition, the first bridge strip 142 and the fifth conductive strips 114 are all connected together through the second bridge strips 144.

Figure 8:
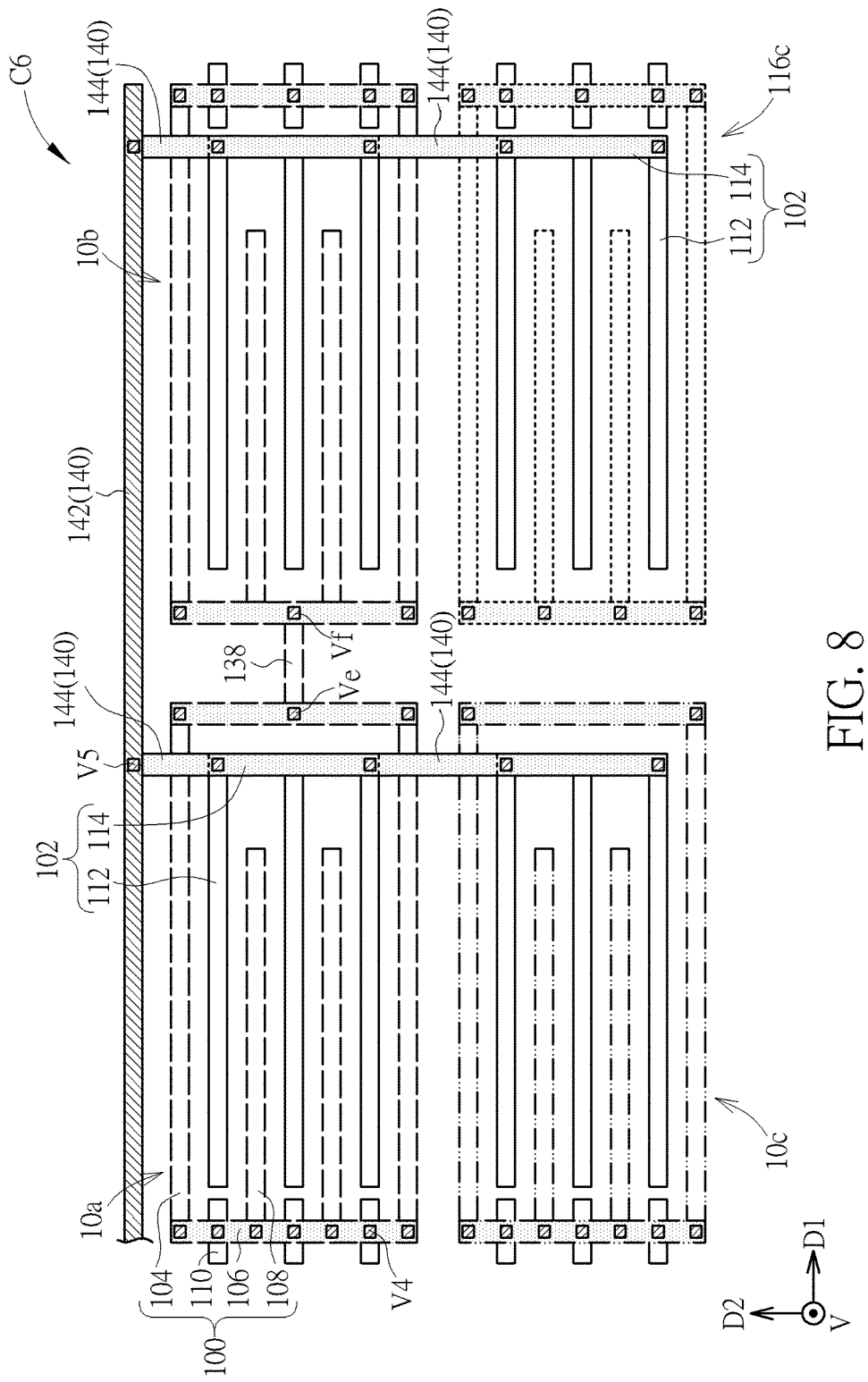
FIG. 8 is a schematic diagram illustrating a top view of a MOM capacitor according to a sixth embodiment of the present invention.

Referring to FIG. 8, FIG. 8 is a schematic diagram illustrating a top view of a MOM capacitor according to a sixth embodiment of the present invention. As shown in FIG. 8, the difference between the MOM capacitor C6 of this embodiment and the fifth embodiment is that the first conductive strips 104, the third conductive strips 108, and the fourth conductive strips 112 are formed of the same patterned conductive layer, such as a first patterned conductive layer, while the second conductive strips 106, the fifth conductive strips 114, and the second bridge strips 144 are formed of another patterned conductive layer, such as a second patterned conductive layer. In addition, the first bridge strip 142 is formed of still another patterned conductive layer, such as a third patterned conductive layer. Each of the second bridge strips 144 is directly connected to one of the fifth conductive strips 114, and at least one of the second bridge strips 144 is electrically connected to the first bridge strip 142 through a fifth via V5. In a variant embodiment, the first bridge strip 142 is formed of the same patterned conductive layer as the first conductive strip 104, and is also electrically connected to the second bridge strips 144 through the vias V5. In another aspect, the structure of the dummy electrode 116c is similar to the first electrodes 100 of the capacitor elements 10a, 10b, 10c. A portion of the dummy electrode 116c that extends in the first direction D1 is formed of the same patterned conductive layer as the first conductive strips 104, the third conductive strips 108, and the fourth conductive strips 112. Another portion of the dummy electrode 116c that extends in the second direction D2 is formed of the same patterned conductive layer as the second conductive strips 106 and the fifth conductive strips 114. These two portions of the dummy electrode 116c are electrically connected through vias. Moreover, the connection line 138 is electrically connected to the second conductive strip 106 of the capacitor element 10a adjoining to the capacitor element 10b through a via Ve, and is electrically connected to the second conductive strip 106 of the capacitor element 10b adjoining to the capacitor element 10a through a via Vf. It is noteworthy that the segmental conductive strips 110 mentioned in the first and fourth embodiments are also placed in each first electrode 100 of the capacitor elements 10a, 10b, 10c. Each segmental conductive strip 110 is formed of the same patterned conductive layer as the fourth conductive strips 112 and is electrically connected to one second conductive strip 106 through a via V4. The placement of the segmental conductive strips 110 provides good isolation performance for the adjoining fourth conductive strips 112 in the first direction D1 from other adjacent external electronic devices.

Figure 9:
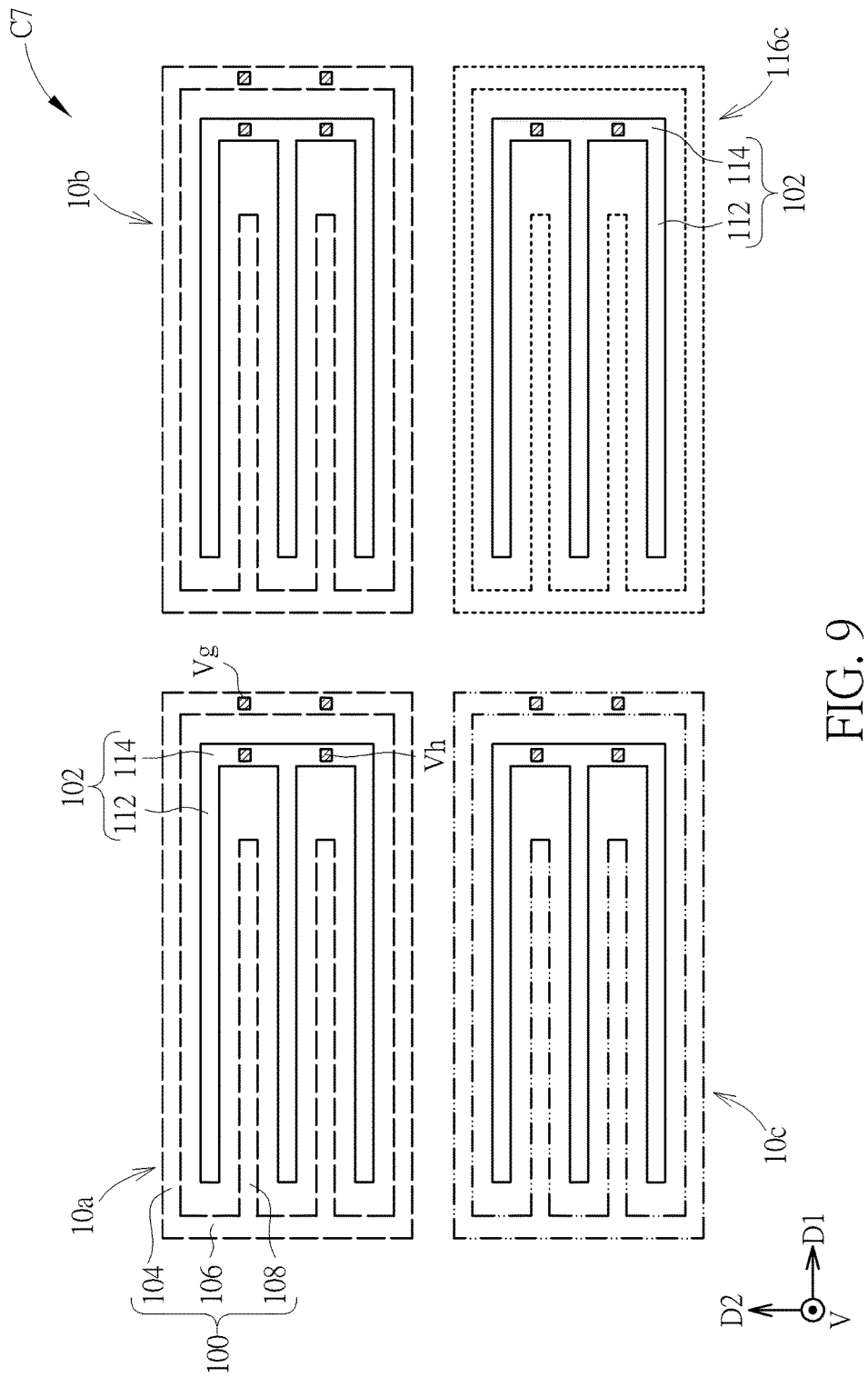
FIG. 9 is a schematic diagram illustrating a top view of a first patterned conductive layer of a MOM capacitor according to a seventh embodiment of the present invention.
Figure 10:
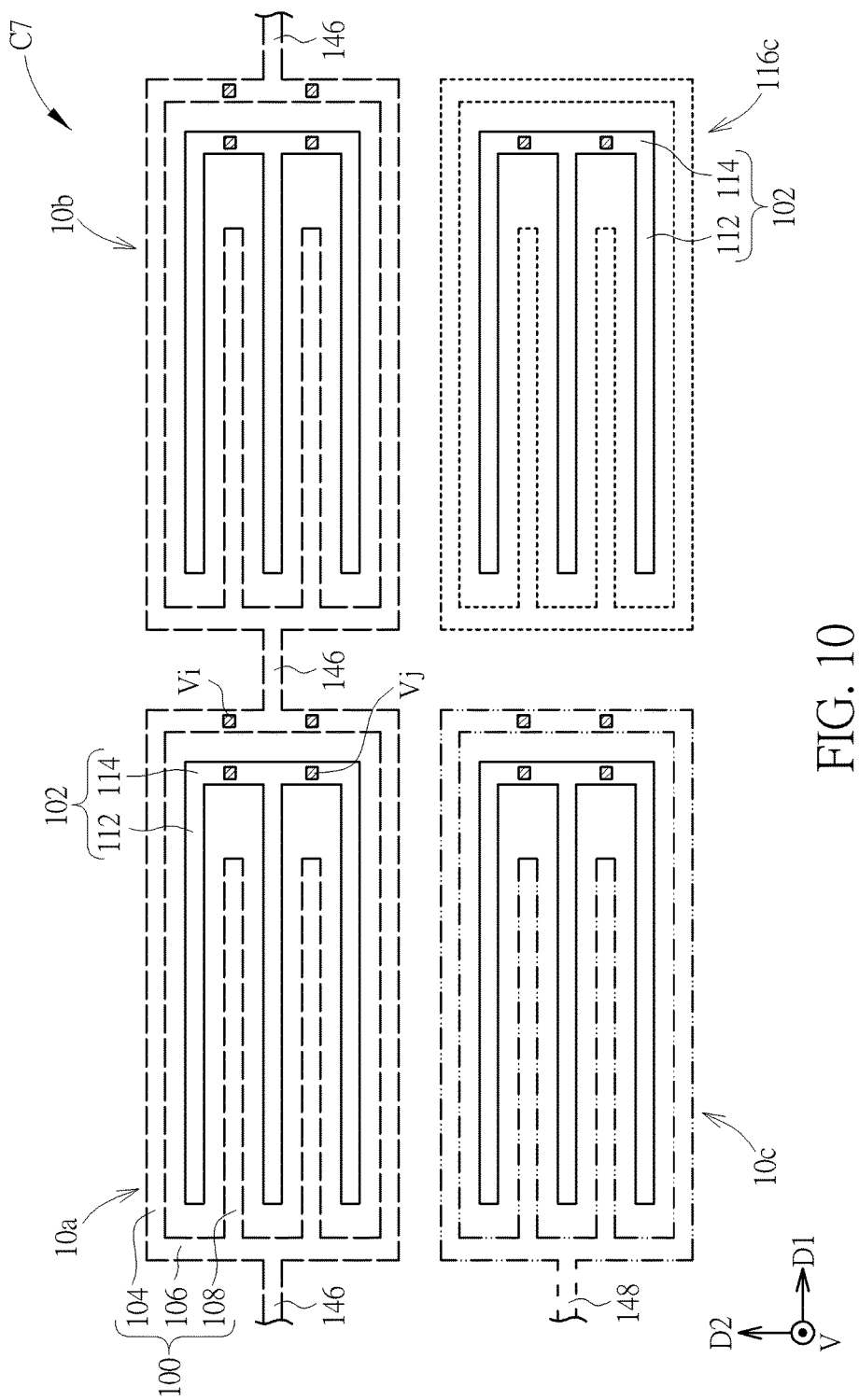
FIG. 10 is a schematic diagram illustrating a top view of a second patterned conductive layer and a third patterned conductive layer of the MOM capacitor according to the seventh embodiment of the present invention.
Figure 11:
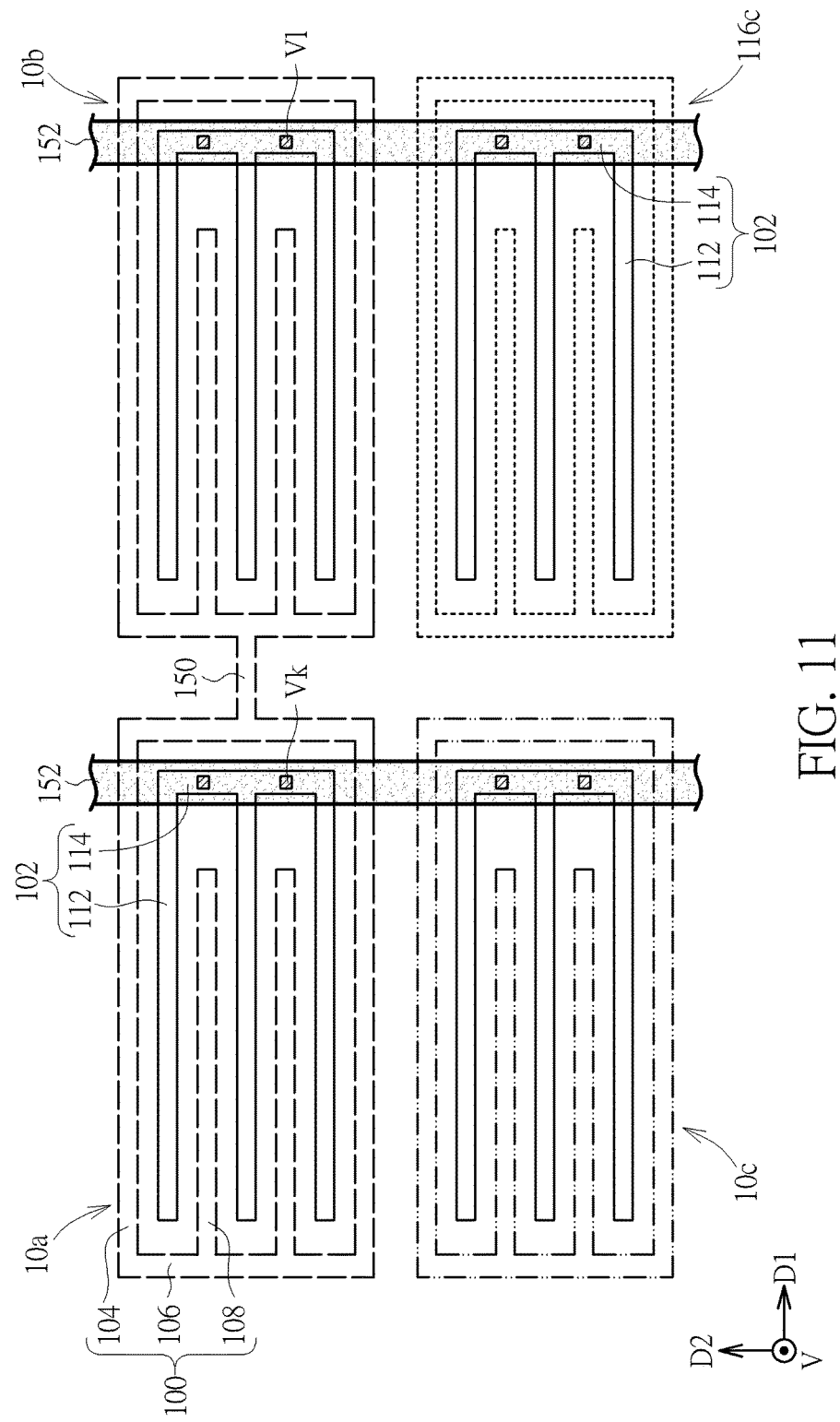
FIG. 11 is a schematic diagram illustrating a top view of a fourth patterned conductive layer and bridge lines of a fifth patterned conductive layer of the MOM capacitor according to the seventh embodiment of the present invention.

FIG. 9 to FIG. 11 are schematic diagrams illustrating top views of a MOM capacitor according to a seventh embodiment of the present invention, wherein FIG. 9 shows the top view of a first patterned conductive layer of the seventh embodiment, FIG. 10 shows the top view of a second patterned conductive layer and a third patterned conductive layer of the seventh embodiment, and FIG. 11 shows the top view of a fourth patterned conductive layer and bridge lines of a fifth patterned conductive layer of the seventh embodiment. In this embodiment, the equivalent circuit of the MOM capacitor C7 can be represented as the circuit shown in FIG. 2. The difference between this embodiment and the fifth embodiment is that the MOM capacitor C7 of this embodiment includes five patterned conductive layers integrated in the vertical projection direction V. Excepting the fifth patterned conductive layer, each of the other patterned conductive layers forms three capacitor elements 10a, 10b, 10c. In other words, the MOM capacitor C7 includes a plurality of capacitor elements, wherein some of them are stacked layer by layer in the vertical projection direction V, and some of them are arranged in juxtaposition in the same layer. As shown in FIG. 9, the projection of two first conductive strips 104 and two second conductive strips 106 in each of the capacitor elements 10a, 10b, 10c form a closed pattern, and each closed pattern of one of the capacitor elements 10a, 10b, 10c is separated from another one of the capacitor elements 10a, 10b, 10c in the vertical projection direction V. In addition, the projection of the dummy electrode 116c is substantially the same as the projection of the first electrodes 100, and therefore the dummy electrode 116c also has a closed pattern, which surrounds a second electrode 102, as mentioned in the sixth embodiment. The capacitor elements 10a, 10b, 10c and the dummy electrode 116c are formed of a first patterned conductive layer. In addition, the first electrode 100 of the capacitor element 10a is electrically connected to the first electrode 100 of another capacitor element 10a in a second patterned conductive layer shown in FIG. 10 through at least one via Vg. The second electrode 102 of the capacitor element 10a is electrically connected to the second electrode 102 of another capacitor element 10a in the second patterned conductive layer shown in FIG. 10 through at least one via Vh. The above mentioned connecting method is also applied to the capacitor elements 10b and 10c and the second electrode 102 surrounded by the dummy electrode 116c.

Referring to FIG. 10, FIG. 10 shows the top views of the second patterned conductive layer and third patterned conductive layer of the MOM capacitor C7, wherein the second and the third patterned conductive layers have the same top views. The difference between the top view of the second patterned conductive layer shown in FIG. 10 and the top view of the first patterned conductive layer shown in FIG. 9 is that the second patterned conductive layer further includes a plurality of first connection lines 146 and a second connection line 148. The first connection lines 146 and the second connection line 148 both extend in the first direction D1, wherein each second conductive strips 106 of the capacitor elements 10a, 10b connects to one first connection lines 146, and the second connection line 148 connects to the second conductive strips 106 of the capacitor element 10c that is not positioned adjoining to the dummy electrode 116c. The first connection line 146 positioned between the capacitor element 10a and the capacitor element 10b is used for electrically connecting the first electrodes 100 of the capacitor elements 10a and 10b, and the other first connection lines 146 can be used for electrically connecting other electronic device to the capacitor element 10a and the capacitor element 10b. Similarly, the second connection line 148 can be used for electrically connecting other electronic device to the capacitor element 10c, but not limited thereto. As a result, the first connection lines 146 and the second connection line 148 can deliver signals or voltages to the corresponding first electrodes 100 of the capacitor elements 10a, 10b, 10c, such that the first electrodes 100 serve as the bottom electrodes or input terminals of the capacitor elements 10a, 10b, 10c. The third patterned conductive layer of the MOM capacitor C7 of this embodiment also includes the first and second connection lines 146, 148. However, in a variant embodiment, the first connection lines 146 or the second connection line 148 may only be arranged in one of the second patterned conductive layer and the third conductive patterned layer. In addition, the first electrode 100 of the capacitor element 10a is electrically connected to the first electrode 100 of another capacitor element 10a in the third patterned conductive layer through at least one via Vi. The second electrode 102 of the capacitor element 10a is electrically connected to the second electrode 102 of another capacitor element 10a in the third patterned conductive layer through at least one via Vj. The above mentioned connecting method is also applied to the capacitor elements 10b and 10c and the second electrode 102 surrounded by the dummy electrode 116c. Moreover, the capacitor elements 10a, 10b, 10c in the third patterned conductive layer can be electrically connected to the corresponding capacitor elements 10a, 10b, 10c in the fourth patterned conductive layer through corresponding vias by the same way mentioned-above.

Referring to FIG. 11, FIG. 11 illustrates the fourth patterned conductive layer and the fifth patterned conductive layer of the MOM capacitor C7, wherein the fifth patterned conductive layer is shown by a dotted pattern shading, while the fourth patterned conductive layer is shown without shading. The pattern of the fourth patterned conductive layer is similar to the first patterned conductive layer shown in FIG. 9, excepting that a first connection line 150 included by the fourth patterned conductive layer is selectively disposed between the capacitor element 10a and the capacitor element 10b, which directly connects to the adjoining second conductive strips 106 of the capacitor element 10a and the capacitor element 10b. Regarding the fifth patterned conductive layer, it includes two bridge lines 152 that extend in the second direction D. One of the bridge lines 152 is electrically connected to the second electrode 102 of the capacitor element 10a and the second electrode 102 of the capacitor element 10c through a plurality of vias Vk, and another bridge line 152 is electrically connected to the second electrode 102 of the capacitor element 10b and the second electrode 102 surrounded by the dummy electrode 116c through a plurality of vias V1. The bridge line 152 may be further electrically connected to each other for electrically connecting all the second electrodes 102 of the capacitor elements 10a, 10b, 10c in the first, second, third, and fourth patterned conductive layers, so as to form a common second electrode. In addition, in each of the capacitor elements 10a, 10b, 10c in this embodiment, the first electrode 100 is a bottom electrode, which may serve as an input terminal, and the second electrode 102 is a top electrode that may serve as an output terminal or be grounded. Therefore, the bridge lines 152 may be grounded or serve as an output terminal to be further electrically connected to an external electronic device.

In a variant embodiment of the seventh embodiment of the present invention, the patterns of each of the first, second, third, and fourth conductive layer can further be separate to two conductive layers, wherein one has the patterns of strips extending in the first direction D1 and another one has the patterns of strips extending in the second direction D2, as the design theory mentioned in the first, second, and fourth embodiments. In this design, segmental strips may further be adopted to provide more effective isolation for the second electrodes.

In summary, in the MOM capacitor of the present invention, each capacitor element includes the first electrode having a closed pattern in the vertical projection direction, and the projection of the second electrode is surrounded by the closed pattern of the projection of the first electrode. In this case, each of the capacitor elements can be prevented from being influenced by each other when the capacitor elements are arranged in an array, and this design also avoids interference between these capacitor and any other outer electronic devices, thus the linearity of the MOM capacitor can be improved. In addition, each capacitor element can be formed of two different patterned conductive layers, wherein the first patterned conductive layer includes the conductive strips that extend in one direction, and the second patterned conductive layer includes the conductive strips that extend in another direction. Therefore, adopting this design can overcome the difficulty of accurately forming the metal strips including curved patterns in the same metal layer in the advanced semiconductor manufacturing technologies with high integration density. Furthermore, when the conductive strips in one of the patterned conductive layer all extend in one direction, the projection of the segmental conductive strips of the first electrode and the projection of the fourth conductive strips of the second electrode are aligned in the extending direction, such that placing the segmental conductive strips in the capacitor element can effectively prevent the second electrode of the capacitor element from being interfered with other capacitor elements around the capacitor element in the extending direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-metal (MOM) capacitor, comprising a capacitor element, wherein the capacitor element comprises:
a first electrode, a projection of the first electrode comprises a closed pattern in a vertical projection direction, wherein the first electrode comprises a plurality of first conductive strips, a plurality of second conductive strips, and a plurality of third conductive strips electrically connected to each other, a projection of each of the first conductive strips is connected to a projection of one of the second conductive strips, and a projection of each of the third conductive strips is connected to the projection of one of the second conductive strips; and
a second electrode, wherein a projection of the second electrode is surrounded by the closed pattern of the projection of the first electrode in the vertical projection direction, wherein the second electrode comprises a plurality of fourth conductive strips and a fifth conductive strip electrically connected to each other, a projection of each of the fourth conductive strips is connected to a projection of the fifth conductive strip,
wherein the first conductive strips, the third conductive strips, and the fourth conductive strips extend in a first direction, the second conductive strips and the fifth conductive strip extend in a second direction, and the first direction crosses the second direction,
wherein the first conductive strips, the third conductive strips, and the fourth conductive strips are formed of a same patterned conductive layer, the second conductive strips and the fifth conductive strip are formed of another patterned conductive layer, each of the first conductive strips is electrically connected to the second conductive strips through a plurality of first vias respectively, each of the third conductive strips is electrically connected to at least one of the second conductive strips through a second via, and each of the fourth conductive strips is electrically connected to the fifth conductive strip through a third via.

2. The MOM capacitor according to claim 1, wherein the third conductive strips are disposed between two of the first conductive strips in the second direction.

3. The MOM capacitor according to claim 2, wherein the third conductive strips and the fourth conductive strips are disposed alternately in the second direction.

4. The MOM capacitor according to claim 1, wherein the first electrode further comprises a plurality of segmental conductive strips, and each of the segmental conductive strips crosses one of the second conductive strips in the vertical projection direction and is electrically connected to the second conductive strip it crosses through a fourth via.

5. The MOM capacitor according to claim 4, wherein each of the third conductive strips is disposed between two of the segmental conductive strips in the second direction, each of the fourth conductive strips is disposed between two of the segmental conductive strips in the first direction, and the fourth conductive strips are isolated from the segmental conductive strips.

6. The MOM capacitor according to claim 5, wherein each of the fourth conductive strips and two of the segmental conductive strips are substantially aligned along the first direction.

7. The MOM capacitor according to claim 1, wherein the MOM capacitor comprises a plurality of capacitor elements stacked in sequence along the vertical projection direction, each of the capacitor elements is formed of two patterned conductive layers, the first electrodes of the capacitor elements are electrically connected to each other, and the second electrodes of the capacitor elements are electrically connected to each other.

8. The MOM capacitor according to claim 1, wherein the projection of each of the third conductive strips is connected to the projections of at least one of the second conductive strips in the vertical projection direction, the projection of the fifth conductive strip crosses or does not cross the projections of the third conductive strips in the vertical projection direction, and the fifth conductive strip is isolated from the third conductive strips.

9. The MOM capacitor according to claim 1, the projection of one of the third conductive strips is connected to the projection of one or more of the second conductive strips that are disposed at the same side of the fifth conductive strip, and the projections of the third conductive strips do not cross the projection of the fifth conductive strip in the vertical projection direction.

10. The MOM capacitor according to claim 1, wherein the MOM capacitor comprises a plurality of capacitor elements arranged in juxtaposition.

11. The MOM capacitor according to claim 10, wherein the MOM capacitor further comprises a bridge line used for electrically connecting the second electrodes of two of the capacitor elements.

12. The MOM capacitor according to claim 11, wherein the bridge line extends in the first direction, the first conductive strips, the third conductive strips, the fourth conductive strips, and the bridge line are formed of a same patterned conductive layer, the second conductive strips and the fifth conductive strips are formed of another patterned conductive layer, and the bridge line is directly connected to one of the fourth conductive strips of two different capacitor elements respectively.

13. The MOM capacitor according to claim 11, wherein the bridge line comprises a first bridge strip extending in the first direction and a plurality of second bridge strip extending in the second direction, the first conductive strips, the third conductive strips, and the fourth conductive strips are formed of a same patterned conductive layer, the second conductive strips, the fifth conductive strips, and the second bridge strips are formed of another patterned conductive layer, each of the second bridge strips is directly connected to one of the fifth conductive strips, and at least one of the second bridge strips is electrically connected to the first bridge strip through a fifth via.

14. The MOM capacitor according to claim 10, wherein the projection of two of the first conductive strips and the projection of two of the second conductive strips in each of the capacitor elements forms the closed pattern, and the closed pattern of one of the capacitor element is connected to the closed pattern of another capacitor element in the vertical projection direction.

15. The MOM capacitor according to claim 14, wherein two of the capacitor elements arranged in a line along the first direction have a common second conductive strip, and two of the capacitor elements arranged in a line along the second direction have a common first conductive strip.

16. The MOM capacitor according to claim 14, wherein in each of the capacitor elements, the first electrode is a top electrode of the capacitor element, the first electrode is grounded or serves as an output terminal, the second electrode is a bottom electrode of the capacitor element, and the second electrode serves as an input terminal.

17. The MOM capacitor according to claim 14, further comprising a dummy electrode, wherein a projection of the dummy electrode is substantially the same as the projection of one of the second electrodes, and the dummy electrode and the capacitor elements are arranged in juxtaposition.

18. The MOM capacitor according to claim 10, wherein the projection of two of the first conductive strips and two of the second conductive strips in each of the capacitor elements forms the closed pattern, and the closed pattern of one of the capacitor element is separated from the closed pattern of another one of the capacitor elements in the vertical projection direction.

19. The MOM capacitor according to claim 18, wherein in each of the capacitor elements, the first electrode is a bottom electrode of the capacitor element, the first electrode serves as an input terminal, the second electrode is a top electrode of the capacitor element, and the second electrode is grounded or serves as an output terminal.

20. The MOM capacitor according to claim 18, further comprising a connection line used for electrically connecting the first electrodes of two of the capacitor elements.

21. The MOM capacitor according to claim 18, further comprising a dummy electrode, wherein a projection of the dummy electrode is substantially the same as the projection of the first electrodes, and the dummy electrode and the capacitor elements are arranged in juxtaposition.

22. The MOM capacitor according to claim 1, wherein the projection of each of the first conductive strips is connected to the projection of at least two of the second conductive strips, the projection of each of the second conductive strips is connected to the projection of at least two of the first conductive strips, and the projection of two of the first conductive strips and the projection of two of the second conductive strips connected to the two first conductive strips form the closed pattern.

* * * * *